United States Patent [19]

Carr et al.

[11] Patent Number: 5,337,219
[45] Date of Patent: Aug. 9, 1994

[54] ELECTRONIC PACKAGE

[75] Inventors: Dennis C. Carr, Rome, Pa.; Edward P. McLeskey, Apalachin; Frank H. Sarnacki, Johnson City, both of N.Y.

[73] Assignee: International Business Machines Corporation, Armonk, N.Y.

[21] Appl. No.: 719,425

[22] Filed: Jun. 24, 1991

[51] Int. Cl.5 .............................................. H05K 1/11
[52] U.S. Cl. .................... 361/794; 174/255; 361/792; 361/793; 361/795; 439/47; 439/44; 439/45
[58] Field of Search ............... 174/262, 263, 264, 265, 174/267; 228/180.1; 357/67, 68, 75, 80; 361/396, 403, 404, 406, 408, 411–414; 439/55, 68, 82, 83, 85, 108

[56] References Cited

U.S. PATENT DOCUMENTS 3,487,530  1/1970  Ely ..................................... 29/402
5,067,007  11/1991 Kanji et al. ........................ 257/778

FOREIGN PATENT DOCUMENTS 1-125965  5/1989  Japan ................................. 439/108

OTHER PUBLICATIONS

IBM Disclosure Bulletin "Module Socket Pins with Insulating Sleeves" by Higgins and Shabe vol. 22 No. 7 Dec. 1979.
IBM Disclosure Bulletin "Insulated Pin for Printed Circuit Cards With Feed-Through Holes" vol. 29 No. 3 Aug. 1986.
IBM TDB "Defective Hole Repair/Hermetic Seal", vol. 23, No. 9 Feb. 1981, F. H. Sarnacki.
IBM TDB, "Backfill System for PCB Rework", vol. 23, No. 11, p. 4883, M. J. Reynolds.
IBM TDB, "Defective Hole Repair", vol. 22, No. 1, pp. 67–68 F. H. Sarnacki.
IBM TDB, "Defective Via Repair", vol. 24, No. 5, p. 2572 Oct. 1981, R. E. Darrow.
IBM TDB, "Cast-Solder Preloading For Stacked Modules", vol. 20 No. 2, pp. 545–546, Jul. 1977, D. L. Rivenburgh.
IBM TDB, "Robotic Hot Air Solder/Desolder Placement Device", vol. 30, No. 1, pp. 114–116, Jun. 1987.
IBM TDB, "Component Rework With Low-Melt Alloy Solder", vol. 21, No. 12, p. 4790, May 1979.

*Primary Examiner*—Leo P. Picard
*Assistant Examiner*—Donald A. Sparks
*Attorney, Agent, or Firm*—Bernard Tiegerman

[57] ABSTRACT

A method for altering an electrical connection in an electronic package including one or more semiconductor chips overlying, i.e., mounted directly onto, or mounted onto one or more modules which are mounted onto, a substrate such as a printed circuit card or printed circuit board, as well as the resulting electronic package, is disclosed. In accordance with a preferred embodiment of the inventive method, at least one plated, solder-filled hole in the substrate is drilled out to eliminate an unwanted electrical connection. A solder region, e.g., a solder ball, is inserted into the drilled out hole into contact with an electrically conductive member, e.g., an electrically conductive pin, extending from, for example, a module into the hole. A cylinder, including a central core of electrically conductive material, encircled by an annulus of electrically insulating material, is inserted into the hole. The solder region is then reflowed to form an electrical and metallurgical bond between the module member and the central core. A new electrical connection is completed by extending a wire bond from the bottom of the central core to the bottom of the central core in another such hole or to the bottom of a solder-filled hole.

14 Claims, 4 Drawing Sheets

ELECTRONIC PACKAGE

BACKGROUND OF THE INVENTION

1. Field of the Invention

The invention pertains to a method for altering one or more electrical connections in an electronic package including one or more semiconductor chips overlying a printed circuit card or printed circuit board, and to the resulting electronic package.

2. Description of the Related Art

Many high-end computer systems currently include one or more electronic packages of the type depicted in FIG. 1. Each such package 10 typically includes one or more semiconductor chips 20 (only one of which is shown), with the chips being mounted either individually or in groups onto the upper surfaces of modules 30, e.g., single-layer modules or multi-layer modules. The chips are, for example, mounted face-down onto the modules, and mechanically and electrically connected to contact pads (not shown) on the modules using solder balls 22 (as depicted in FIG. 1). Alternatively, the chips are mounted face-up, and mechanically and electrically connected to contact pads on the modules using wire bonds (not shown).

In the case of some (but not all) multi-layer modules, each mounted chip 20 is encircled by an array of engineering change (EC) contact pads (not shown) formed on the upper surface of the corresponding multi-layer module 30. As discussed more fully below, these EC pads are currently included on some of the multi-layer modules so as to permit electrical connections to be altered. Significantly, the need for, and the presence of, the EC pads on these modules limits the density of chips 20 on the modules 30.

As shown in FIG. 1, each single-layer or multi-layer module 30 includes a plurality of electrically conductive pins 40 extending from the bottom of the module. If module 30 is a single-layer module, then the pins 40 typically also extend through the full thickness of the module, whereas if the module is a multi-layer module, then the pins may, for example, extend only partially through the thickness of the module. In the case of a single-layer module, the integrated circuits formed in and on the semiconductor chips 20 mounted on the module 30 are electrically connected to the pins 40 through printed wires (not shown) on the upper surface of the module. In the case of a multi-layer module 30, the integrated circuits formed in and on the semiconductor chips 20 mounted on the module 30 are electrically connected to the pins 40 through printed wires (not shown) on the upper surface of, and plated via holes extending partially through the thickness of, the module.

The chip-bearing modules 30 of the electronic package 10 are themselves mounted onto a multi-layer substrate 50 which is, for example, a printed circuit card or printed circuit board. The substrate 50, through which electrical power and electrical signals are communicated to the chips 20, includes at least one layer 60 of electrically conductive material, e.g., copper, which has been patterned into a plurality of strips, called signal traces or signal lines. Electrical signals are transmitted along the signal traces to the semiconductor chips 20 and hence the patterned layer 60 is termed a signal plane. The substrate 50 also includes at least one layer 70 of electrically conductive material, e.g., copper, along which electrical power is communicated to the semiconductor chips 20, and thus the layer 70 is termed a power plane. The substrate 50 further includes at least one layer 80 of electrically conductive material, e.g., copper, which serves as a ground plane. The signal, power and ground planes 60, 70 and 80 are separated by layers 90 of electrically insulating material, e.g., layers of polyimide-based material.

In order to mount the modules 30 onto the substrate 50 and provide electrical connections between the chips 20 and the signal, power and ground planes of the substrate 50, holes 100, e.g., stepped holes, are initially drilled into the substrate 50, extending through the thickness of the substrate and intersecting the signal plane 60, the power plane 70 or the ground plane 80. These holes are conventionally plated with an electrically conductive, solder-wettable material, such as copper. The desired mounting and electrical connections are achieved by inserting the pins 40 of the modules 30 into the holes, and using conventional wave soldering techniques to fill the holes with (electrically conductive) solder.

If EC pads are not provided on the modules 30, as is the case with single-layer modules and most multi-layer modules, then, as depicted in FIG. 1, EC pads 104 (only one of which is shown) are provided on the upper surface of the substrate 50, encircling each module 30. Each such EC pad 104 is typically a portion, or an extension, of a land encircling a plated via hole 108 extending from the upper surface of the substrate 50 to, for example, the signal plane 60, the power plane 70 (as depicted in FIG. 1) or the ground plane 80. Typically, each such plated via hole 108 is filled with (electrically conductive) solder using conventional wave soldering techniques. Significantly, just as the presence of EC pads on certain multi-layer modules 30 limits the density of chips on the modules, the presence of EC pads on the substrate 50 limits the density of modules on the substrate 50, and therefore limits the density of chips in the electronic package 10.

Referring now to FIG. 2, there are instances in which electrical connections between one or more chip components and either the signal plane 60, the power plane 70 or the ground plane 80 of the substrate 50 must be changed. For example, such a change may be the result of a design change (commonly referred to as an engineering change). Alternatively, the change may be the result of a fault, e.g., a short circuit, discovered during the manufacturing process (with the corresponding change being commonly referred to as rework), or of a fault found at the end of the manufacturing process (with the corresponding change being commonly referred to as repair). In any event, such a change is conventionally effected by first removing the relevant module 30 from the substrate 50. Then, one or more solder-filled holes 100 are drilled out with a mechanical drill, so as to remove the unwanted or faulty electrical connections, and each of the drilled-out holes is plugged with a solid cylinder 110 of electrically insulating material. Finally, the chip-bearing module 30 is re-mounted onto the substrate 50 and, if EC pads are provided on the substrate 50, then, as depicted in FIG. 2, wire bonds are extended from contact pads (not shown) on the module to which the chip or chips are electrically connected to EC pads 104 on the substrate 50 to effect new electrical connections. Alternatively, if EC pads are provided on the module, then wire bonds are extended from the contact pads on the module to which the chip or chips are electrically connected to EC contact pads on the module (which are electrically connected to different pins 40, and thus to different signal planes or signal traces, power planes or ground planes) to effect new electrical connections. It should be noted that while this procedure is effective, the need to remove the module 30 from the substrate 50 is inconvenient and significantly increases the cost of the electronic package 10.

Thus, those engaged in the development and manufacture of electronic packages have sought, thus far without success, methods for effecting engineering changes, rework and repair which avoid the need for EC pads and avoid the need for removing chip-bearing modules from substrates such as cards and boards.

SUMMARY OF THE INVENTION

The invention involves a method for achieving engineering changes, rework and repair in an electronic package which includes at least one semiconductor chip overlying a multi-layer substrate such as a printed circuit card or printed circuit board, as well as the resulting electronic package. (As used here, the term overlying means that the at least one semiconductor chip is either mounted on a module which is mounted on the multi-layer substrate, or is mounted directly on the multi-layer substrate.) The inventive method is significant because, among other reasons, it largely avoids, or at least substantially reduces, the need for EC pads on modules and/or on substrates such as cards or boards, while also avoiding the need for removing chips and/or chip-bearing modules from cards or boards.

In accordance with a preferred embodiment of the inventive method, an engineering change, rework or repair is achieved by drilling out at least one solder-filled, plated through hole from the backside of the corresponding substrate so as to eliminate an unwanted electrical connection, without removing the corresponding chip or chip-bearing module mounted on the substrate. A flux-covered solder region, e.g., a flux-covered solder ball, is inserted into the drilled-out hole, followed by the insertion of a cylinder which includes a central core of electrically conductive material encircled by an annulus of electrically insulating material. The presence of the flux-covered solder region in the hole implies that the top of the cylinder is necessarily positioned below the top of the drilled-out hole. The flux-covered solder region is melted and reflowed to form a metallurgical connection between the central core of the cylinder and an electrically conductive member, e.g., a pin, extending from, for example, the corresponding module into the hole. Melting and reflow of the solder region is achieved by, for example, initially heating the substrate in an oven and subsequently directing a flow of heated nitrogen toward the bottom of the central core. A wire bond is then extended from the bottom of the central core to the bottom of another such central core or to the bottom of the solder in an undrilled, solder-filled hole, on the backside of the substrate, to effect a new electrical connection.

Because the inventive method avoids the need for EC pads, the density of semiconductor chips on the modules and/or on the cards or boards, as well as the density of modules on the cards or boards, employed in the corresponding electronic packages is significantly higher than was previously possible. In addition, because the inventive method does not require the removal of chips or chip-bearing modules from cards or boards, the corresponding electronic packages are manufactured more cheaply than was previously possible.

BRIEF DESCRIPTION OF THE DRAWINGS

The invention is described with reference to the accompanying drawings, wherein.

DETAILED DESCRIPTION OF THE PREFERRED EMBODIMENTS

The invention involves a method for achieving engineering changes, rework or repair in an electronic package including one or more semiconductor chips overlying (as defined above) a multi-layer substrate such as a printed circuit card or printed circuit board, as well as the resulting electronic package. Significantly, the inventive method does not require the use of EC pads and, as a consequence, the density of semiconductor chips on the modules and/or on the cards or boards, as well as the density of modules on the cards or boards, employed in the corresponding electronic packages is significantly higher than was previously possible. In addition, the inventive method does not require the removal of chips or chip-bearing modules from cards or boards, and therefore the corresponding electronic packages are manufactured more cheaply than was previously possible.

With reference to FIGS. 5–8, each of four embodiments of an electronic package 1000 of the type to which the inventive method is applicable includes one or more semiconductor chips 120, e.g., silicon chips or gallium arsenide chips, overlying a multi-layer substrate 150, e.g., a printed circuit card or printed circuit board. That is, these chips are, for example, mounted individually or in groups onto modules 130, which are mounted onto the multi-layer substrate 150, as is the case with the embodiments depicted in FIGS. 5–7. Alternatively, these chips are mounted directly onto the multi-layer substrate 150, as is the case with the embodiment depicted in FIG. 8.

Figure 5:
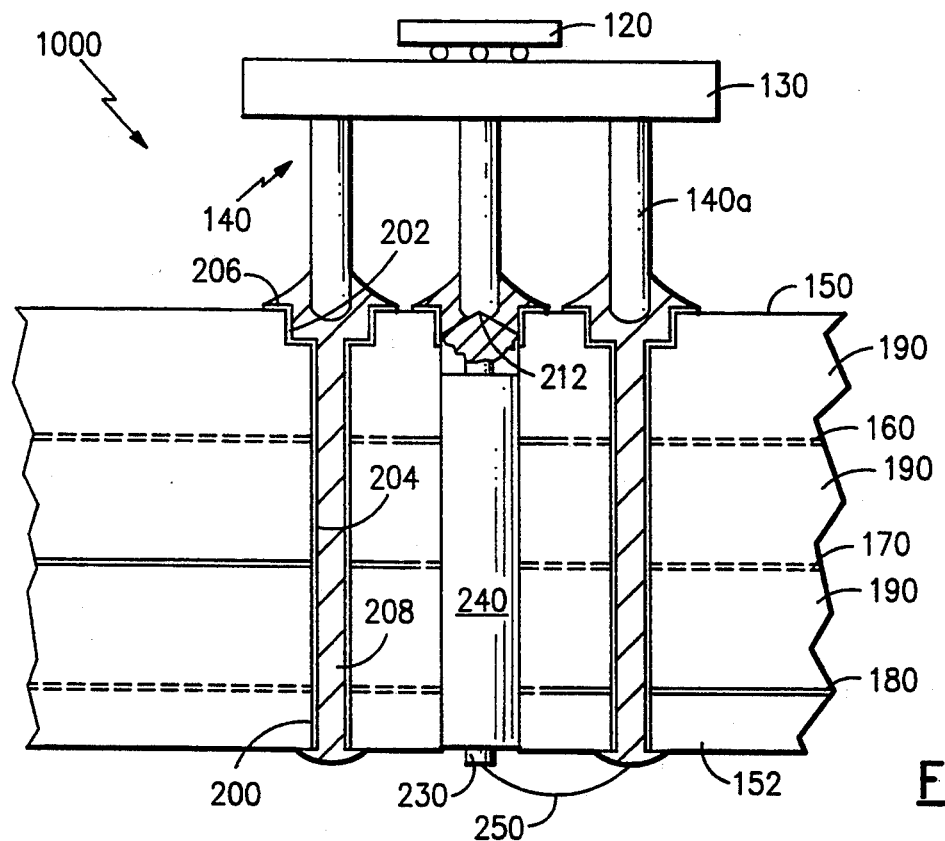
FIGS. 5–8 are cross sectional views of four embodiments of an electronic package to which the inventive method has been applied.
Figure 6:
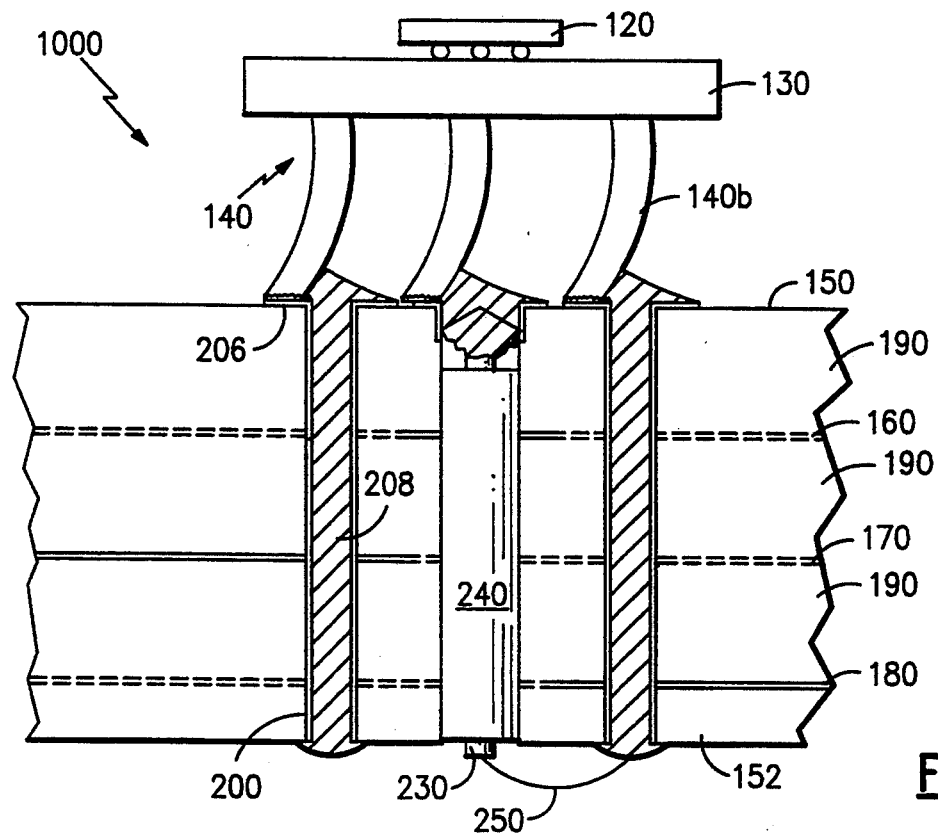
Figure 7:
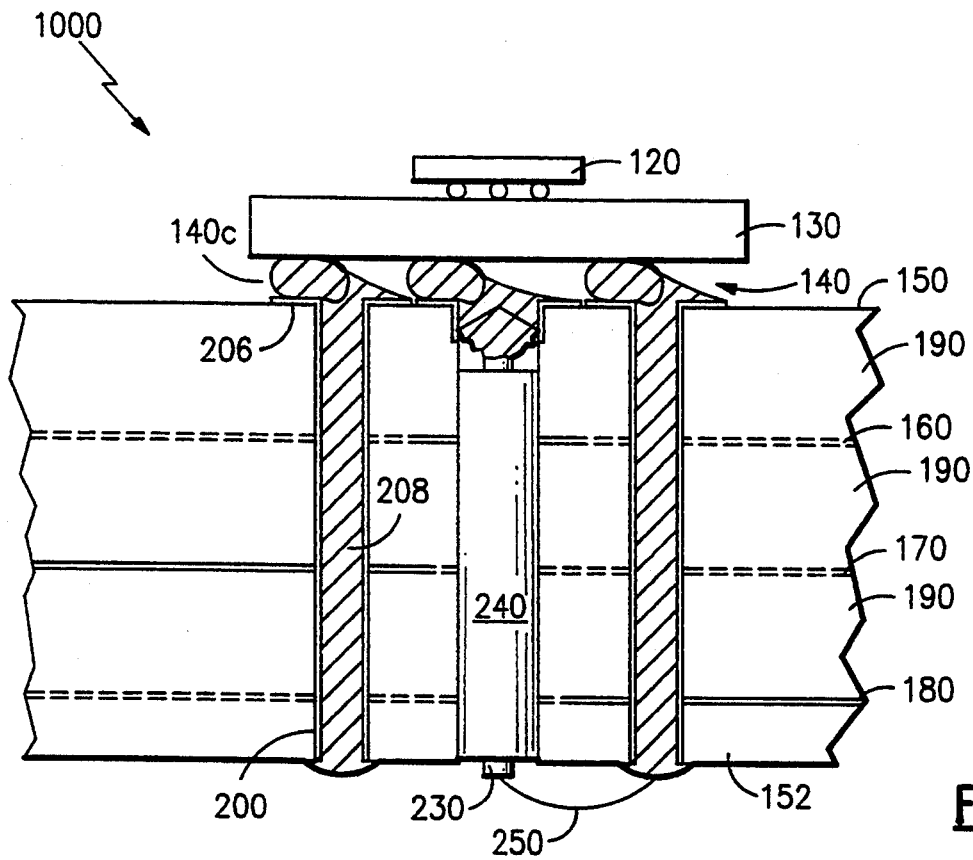

The modules 130 depicted in FIGS. 5–7 are single-chip modules or multi-chip modules, and are either single-layer modules or multi-layer modules. The single-layer modules 130 are manufactured from, for example, a ceramic such as $Al_2O_3$. The multi-layer modules 130 include a base layer of, for example, a ceramic such as $Al_2O_3$, topped by successive layers of, for example, a polyimide-based material. The chips 120 mounted on the modules 130 are mounted either face-down onto contact pads on the modules using solder balls (as depicted in FIGS. 5–7), or are mounted face-up, using wire bonds.

It should be noted that if the modules 130 are multi-layer modules, then, in accordance with the invention, the modules 130 include relatively few, or no, EC pads encircling the chips 120. Consequently, the density of chips 120 on the multi-chip, multi-layer modules 130 employed in the invention is significantly higher than was previously possible.

If the chips 120 are mounted on modules 130, then, as shown in FIGS. 5–7, each module 130 includes a plurality of electrically conductive members 140 extending from the module. As depicted in FIG. 5, the members 140 are, for example, electrically conductive pins 140a having diameters of, for example, 0.020 inches (in), and are fabricated from, for example, an alloy of Be and Cu. Alternatively, as depicted in FIG. 6, the electrically conductive members 140 are flexible leads 140b having widths of, for example, 0.010 in, which are fabricated from, for example, an alloy of Be and Cu. In yet another alternative, depicted in FIG. 7, the electrically conductive members 140 are regions of solder 140c, e.g., solder balls, having sizes, e.g., diameters, of, for example, 0.025 in and having a composition which includes, for example, 42% (by weight) of Sn and 58% Bi. The semiconductor chips 120 mounted on each module 130 are electrically connected to the members 140 through printed wires (not shown) on the upper surface of, and/or plated via holes (not shown) extending through the thickness of, the module 130.

The modules 130 of the electronic package 1000 are mounted onto a multi-layer substrate 150 which is, for example, a printed circuit card or printed circuit board. The substrate 150 includes at least one layer 160 of electrically conductive material which has been patterned into a plurality of signal traces to form at least one signal plane. The layer 160 is, for example, of copper and has a thickness of, for example, 0.0014 in. The substrate 150 also includes at least one layer 170 of electrically conductive material which serves as a power plane and at least one layer 180 of electrically conductive material which serves as a ground plane. Each of the layers 170 and 180 is, for example, of copper and each has a thickness of, for example, 0.0052 in.

The electrically conductive layers 160, 170 and 180 are separated by layers 190 of electrically insulating material. Each layer 190 is, for example, of polyimide and has a thickness of, for example, 0.004 in.

By way of example, a substrate 150 encompassed by the present invention includes 20 signal planes of copper, 10 power planes of copper and 1 ground plane of copper, separated by layers of polyimide. Based upon the thicknesses given above, the total thickness of this exemplary substrate is 0.200 in.

With reference once again to FIGS. 5–7, in order to mount the modules 130 onto the substrate 150 and provide electrical connections between the chips 120 and the signal, power and ground planes, holes 200, e.g., stepped holes (as depicted in FIG. 5), are provided extending through the thickness of the substrate 150. These holes are readily formed using conventional drilling techniques, e.g., conventional mechanical or conventional laser drilling techniques. The relatively wide portions 202 of the stepped holes 200, which receive the pins 140a, have diameters of, for example, 0.035 in, and depths of, for example, 0.014 in. The diameters of the relatively narrow portions of the holes 200 are related to the thickness of the substrate 150, i.e., these diameters generally increase as the thickness of the substrate 150 increases. In the case of a substrate 150 having a total thickness of, for example, 0.200 in, the diameters of the relatively narrow portions of the holes 200 are, for example, 0.020 in.

The holes 200 are plated, e.g., electroplated, with an electrically conductive material which is preferably solder-wettable. Such a material is, for example, copper. Typically, the plating process is also used to form lands 206 encircling the holes. After the plating process, the modules 130 are mounted onto the substrate 150 by bringing the electrically conductive members 140 into electrical contact with the electrically conductive, plated material in the holes 200. For example, if the electrically conductive members 140 are pins 140a (see FIG. 5), then the pins are inserted into the holes into electrical contact with the plated material. Alternatively, if the electrically conductive members 140 are flexible leads 140b (see FIG. 6), then the leads are connected, e.g., soldered, to the lands 206 encircling the plated holes. Similarly, if the electrically conductive members 140 are regions of solder 140c (see FIG. 7), e.g., solder balls, then the modules 130 with the solder regions 140c are mounted onto the lands 206 encircling the plated holes and the solder regions 140c are melted to form the desired electrical connections. Preferably, although not essential, as shown in FIGS. 5–7, conventional wave soldering techniques are used to fill the plated holes with electrically conductive solder, e.g., solder having a composition which includes 42% (by weight) Sn and 58% Bi, to ensure the existence of continuous electrical connections between the modules 130 and the signal, power and ground planes 160, 170 and 180.

Figure 8:
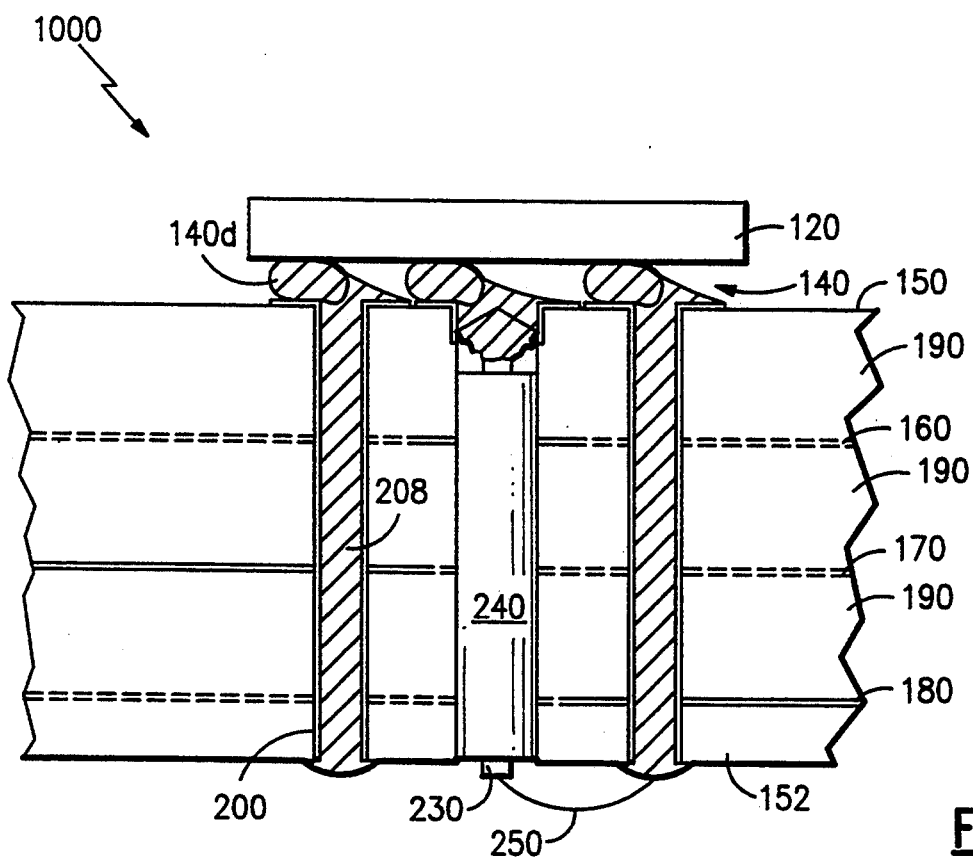

If the chips 120 are mounted directly onto the substrate 150, as is the case with the embodiment depicted in FIG. 8, then each chip 120 includes electrically conductive members 140 which are, for example, regions of solder 140d, e.g., solder balls. These solder regions 140d have sizes, e.g., diameters, of, for example, 0.010 in, and have a composition which includes, for example, 90% (by weight) Sn and 10% Pb.

The substrate 150 onto which the chips 120 are directly mounted includes, as before, at least one signal plane 160, at least one power plane 170 and at least one ground plane 180 of, for example, molybdenum. These electrically conductive layers are separated by electrically insulating layers 190 of, for example, polytetrafluoroethylene. The thicknesses of these various layers are, for example, the same as those given above.

As before, the substrate 150 of the embodiment depicted in FIG. 8 includes holes 200 having diameters of, for example, 0.003 in which extend through the thickness of the substrate. These holes are, for example, plated and filled with electrically conductive solder. These holes are also encircled by lands onto which the chips 120 and solder regions 140d are mounted, with the solder regions 140d being melted to achieve the desired mechanical and electrical connections between the chips 120 and substrate 150.

In the event that an electrical connection is to be altered in any of the embodiments described above, as a result of, for example, an engineering change, rework or repair, then, in accordance with the inventive method, and without removing any of the chips 120 or chip-bearing modules 130, the electrically conductive material 208, e.g., the solder and solder-wettable material, in the relevant hole 200 is preferably substantially entirely removed, or is removed at least to a depth sufficient to eliminate the unwanted electrical connection, starting from the backside 152 of the substrate 150. This is readily achieved by, for example, drilling out the hole from the backside of the substrate 150 using, for example, conventional mechanical drilling techniques. The diameter of such a drilled-out hole is necessarily equal to or greater than the original diameter of the hole (e.g., 0.020 in) and is, for example, 0.029 in. Surprisingly, it has been found that the alignment between a conventional mechanical drill, such as a mechanical drill having a diameter of 0.029 in, and a member 140 extending into the top of the hole 200, is readily maintained while drilling out the hole 200 even through the full thickness of the substrate 150 without any changes in conventional drilling techniques. For example, it has been found that such alignment is readily maintained while drilling out holes extending through substrate thicknesses of, for example, 0.1 in, 0.2 in and even 0.3 in.

If the hole 200 is substantially completely drilled out and if the member 140 is, for example, a pin 140a, then drilling is preferably continued until a small fillet 212, having a depth of, for example, 0.18 in, is drilled into the pin 140a extending into the hole. Such a fillet results in improved solder wetting and a better solder bond, more fully described below.

Figure 3:
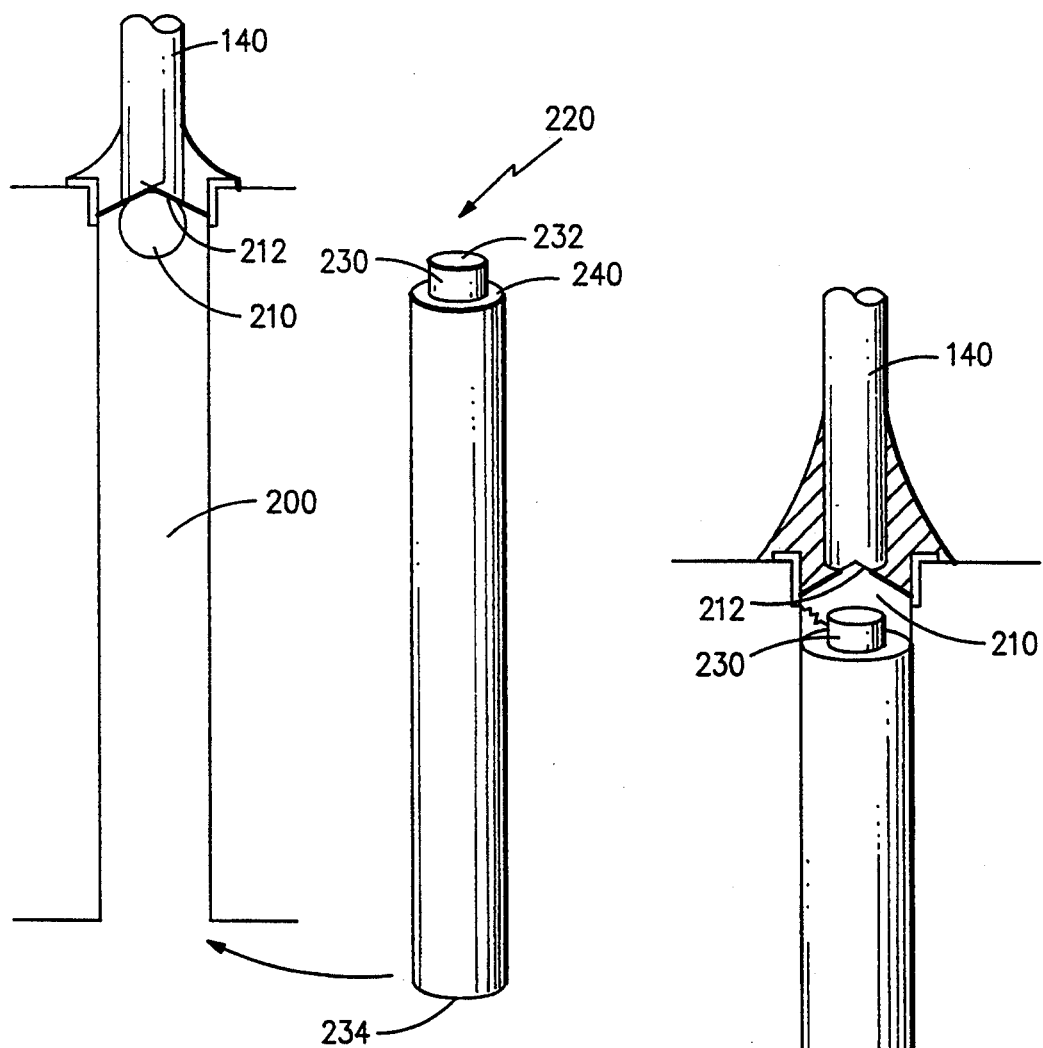
FIGS. 3 and 4 depict a preferred embodiment of the inventive method for effecting an engineering change, repair or rework.

With reference now to FIG. 3, in accordance with the invention, after the electrically conductive material 208 in the hole 200 has, for example, been substantially entirely removed, a flux-covered region 210 of electrically conductive solder, e.g., a flux-covered solder ball, is inserted into the hole. The purpose of this solder region 210 is to provide an electrical connection between the member 140 and the electrically conductive core of a cylinder 220, described below, which is subsequently inserted into the hole. If the member 140 is, for example, a pin 140a extending into the hole, then the solder region 210 is brought into physical contact with the pin. If, on the other hand, the member 140 is a flexible lead 140b or a solder ball 140c or 140d contacting a land encircling the hole, then the solder region 210 is brought into contact with, for example, electrically conductive plating material and/or solder remaining in the hole and extending out of the hole into contact with the member 140. It should be noted that if less than substantially all of the solder and solder-wettable material has been removed, i.e., just enough material has been removed to eliminate the unwanted electrical connection, then no solder region 210 is needed provided the amount of solder remaining in the hole is essentially identical in size to the size of the solder region 210, as discussed below. The composition of the solder region 210, if used, includes, for example, 42% (by weight) of Sn and 58% of Bi for the embodiments of FIGS. 5–7 and includes, for example, 90% Sn and 10% Pb for the embodiment of FIG. 8. The composition of the flux covering the solder region 210 includes, for example, a conventional alcohol-based flux.

The size, e.g., the diameter, of the solder region 210 should be at least 50%, and preferably 100%, that of the drilled-out hole 200. Percentages less than 50% are undesirable because they generally result in undesirably weak solder bonds, as more fully discussed below.

After the solder region 210 is inserted into the hole 200, or if no such solder region 210 is employed because a sufficient amount of solder remains in the hole, then a cylinder 220, having a length substantially equal to the length of the hole 200, is inserted into the hole. The presence of the solder region 210 in the hole, or the solder remaining in the hole used in lieu of the solder region 210, implies that after the cylinder 220 is inserted into the hole, the top 232 of the cylinder 220 is necessarily positioned below the top of the hole. This cylinder, depicted in FIG. 3, includes a solid, central core 230 of electrically conductive material, e.g., a core formed from an alloy of Be and Cu, encircled by an annulus 240 of electrically insulating material, e.g., polycarbonate. While not essential, the core 230 is preferably essentially free of solder.

The diameter of the central core 230 of the cylinder 220 ranges from about 40% to about 60%, and is preferably about 45%, the diameter of the hole, with the annulus 240 of insulating material taking up the remaining space in the hole. Percentages less than about 40% are undesirable because the corresponding central cores have undesirably low stiffness, while percentages greater than about 60% are undesirable because the corresponding amounts of insulating material in the encircling annuli are undesirably low. In addition, the ends of the central core 230 should extend from the electrically insulating annulus 240 by at least 0.010 in to permit the formation of an electrical and metallurgical bond and to permit ease of wire bonding, as more fully discussed below.

After inserting the cylinder 220 into the hole 200, an electrical and metallurgical bond is formed between the member 140 and the central core 230 of the cylinder 220 by melting the solder region 210 or the solder remaining in the hole. (Hereinafter, any reference to the solder region 210 is intended to generically encompass the solder region 210, per se, or the solder remaining in the hole which is used in lieu of the solder region 210. In addition, a metallurgical bond, for purposes of the present invention, is one in which no voids or discontinuities are visible when viewed under a 500× optical microscope.) Preferably, such a bond is achieved by initially heating the entire substrate 150 to a temperature close to the melting point of the solder region 210 by, for example, placing the substrate 150 in a heated oven or under infra-red lamps. For example, if the solder region 210 has a composition which includes 42% Sn and 58% Bi, then the melting point of the solder region 210 will be 281° F. Consequently, the substrate 150 is preferably initially heated to a temperature of, for example, 190° F. in, for example, an oven.

Figure 4:
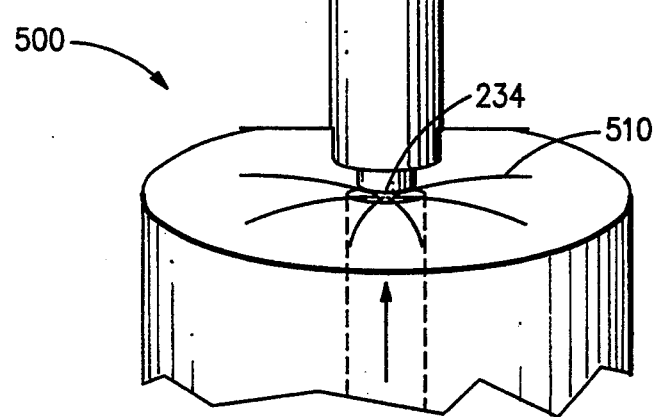

With reference now to FIG. 4 in connection with FIG. 3, after the substrate 150 has been heated, the solder region 210 is further heated to its melting temperature by heating just the central core 230 of the cylinder 220. This is readily accomplished by, for example, directing a flow 510 of heated inert gas, such as nitrogen, at the bottom 234 of the central core 230. Devices 500 for producing such heated gas flows 510 are well known, are commercially available, and one such useful device is sold by GTE Sylvania of Exeter, N.H. under the trade name Serpentine Gas/Air Heater. Because the electrically conductive layers in the substrate 150 serve as heat sinks, it is generally necessary to heat the central core 230 to a temperature sufficiently in excess of the melting temperature of the solder region 210 to ensure that the solder region melts. In general, it has been found that heating the central core 230 to a temperature which is at least 35° F. in excess of the melting temperature of the solder region is adequate. Thus, for example, if the solder region 210 has the Sn-Bi composition given above, the central core 230 should be heated to a temperature of at least 316° F. Moreover, it has been found that the heating of the central core 230 should be maintained for at least one minute, and that the resulting melted solder region 210 and central core 230 should be allowed to cool for at least 30 seconds, to ensure the formation of a useful electrical and metallurgical bond.

After the formation of the electrical and metallurgical bond, a wire bond 250 is extended from the bottom 234 of the central core 230 to the bottom of another such central core or to the bottom of the solder filling a hole 200 (as depicted in FIGS. 5–8) to complete the desired engineering change, rework or repair.

Figure 1:
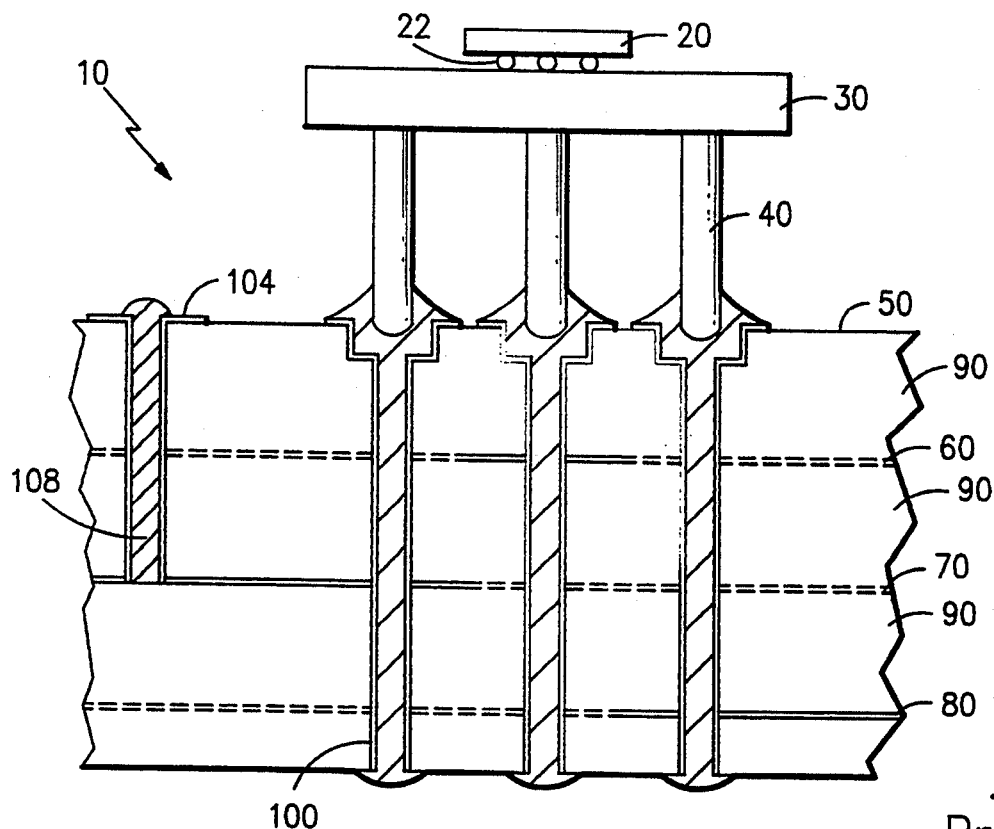
FIG. 1 is a cross sectional view of a conventional electronic package, including a chip-bearing module mounted onto a substrate such as a card or board.
Figure 2:
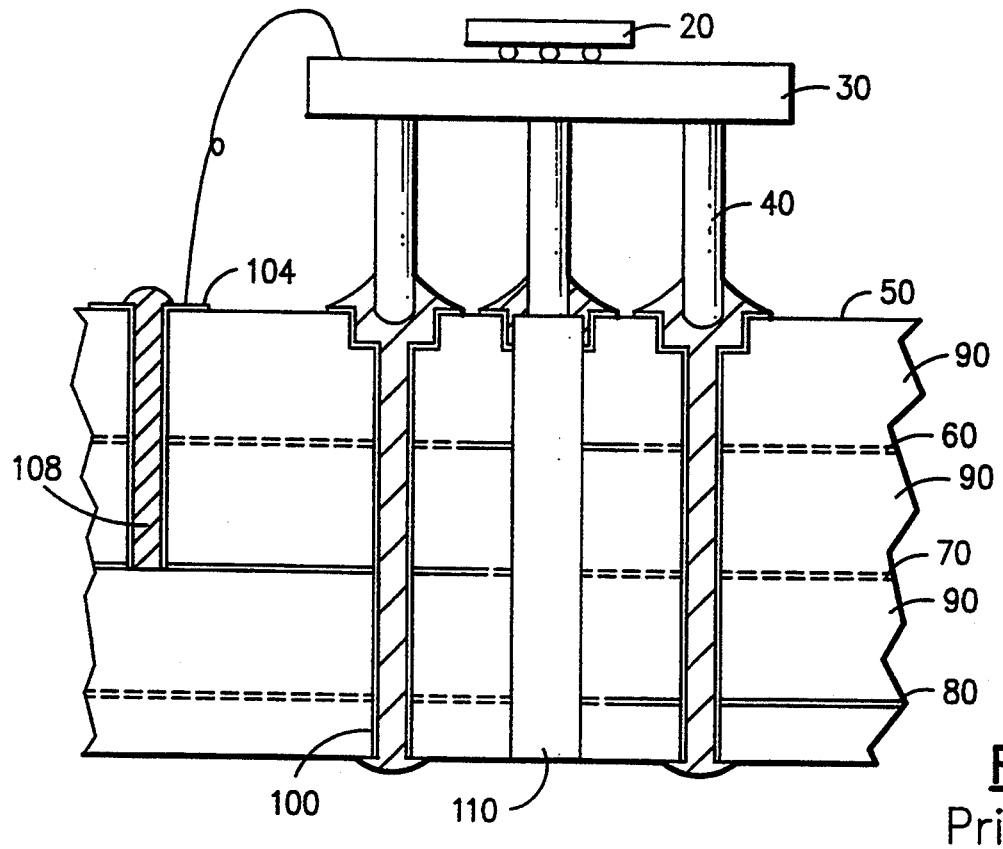
FIG. 2 is a cross sectional view of a conventional electronic package, similar to the one depicted in FIG. 1, in which an engineering change, repair or rework has been effected employing conventional techniques.

It should be noted that in conventional electronic packages 10, of the type depicted in FIGS. 1 and 2, the presence of EC pads on the substrate 50 limits the density of modules on the substrate, measured as a percentage of the substrate surface area available to modules, to no more than 33%. By contrast, in the electronic packages 1000 associated with the present invention, by virtue of the inventive method, the corresponding densities are higher than 66%, and even as high as 100%.

It should also be noted that because the chips 120 and/or modules 130 need not be removed from the substrate 150 when implementing engineering changes, rework or repair using the inventive method, the cost of manufacturing the resulting electronic packages 1000 is reduced by at least 25%, and often as much as 50%.

While the invention has been particularly shown and described with reference to preferred embodiments thereof, it will be understood by those skilled in the art that various changes in form and details may be made therein without departing from the spirit and scope of the invention.

We claim:

1. An electronic package, comprising:
at least one semiconductor chip; and
a multi-layer substrate, said semiconductor chip overlying, and being electrically connected to, said multi-layer substrate which includes at least one electrically conductive signal plane, at least one electrically conductive power plane and at least one electrically conductive ground plane, separated by layers of electrically insulating material, said substrate also including at least a first hole extending through the thickness of said substrate and containing electrically conductive material, said first hole having a top and a bottom, said semiconductor chip being electrically connected to the electrically conductive material in said first hole, Characterized In That
said first hole contains a first cylinder which includes a first annulus of electrically insulating material encircling a first core of electrically conductive material, said first cylinder including a top which is positioned below said top of said first hole, said first core including first and second ends, said first end being electrically connected to said semiconductor chip.

2. The electronic package of claim 1, further comprising at least one module, positioned between said semiconductor chip and said substrate, said module including at least one electrically conductive member extending from said module, said semiconductor chip being mounted on said module and being electrically connected to said member, said first end of said first core being electrically connected to said member via electrically conductive material extending from said first end to said member.

3. The electronic package of claim 2, wherein the electrically conductive material extending from said first end of said first core to said member includes metallic material constituting a metallurgical connection between said first core and said member.

4. The electronic package of claim 3, wherein said metallic material includes solder.

5. The electronic package of claim 4, wherein said solder includes tin and bismuth.

6. The electronic package of claim 1, wherein said substrate includes a second hole containing electrically conductive material and wherein said electronic package further comprises an electrical connection extending from said second end of said first core to the electrically conductive material in said second hole of said substrate.

7. The electronic package of claim 1, wherein said substrate includes a second hole containing a second cylinder which includes a second annulus of electrically insulating material encircling a second core of electrically conductive material, said second core including first and second ends, and wherein said electronic package further comprises an electrical connection extending from said second end of said first core to said second end of said second core.

8. The electronic package of claim 2, wherein said electrically conductive member is an electrically conductive pin.

9. The electronic package of claim 2, wherein said electrically conductive member is an electrically conductive, flexible lead.

10. The electronic package of claim 2, wherein said electrically conductive member is an electrically conductive region of solder.

11. The electronic package of claim 1, wherein said semiconductor chip includes at least one electrically conductive member extending from said chip, said first end of said first core being electrically connected to said member via electrically conductive material extending from said first end to said member.

12. The electronic package of claim 11, wherein said electrically conductive member is an electrically conductive region of solder.

13. The electronic package of claim 1, wherein said substrate is a printed circuit card.

14. The electronic package of claim 1, wherein said substrate is a printed circuit board.

* * * * *